(12) United States Patent
Subramanian et al.

(10) Patent No.: US 6,313,019 B1
(45) Date of Patent: Nov. 6, 2001

(54) Y-GATE FORMATION USING DAMASCENE PROCESSING

(75) Inventors: Ramkumar Subramanian, San Jose; Christopher F. Lyons, Fremont; Bhanwar Singh, Morgan Hill; Marina Plat, San Jose, all of CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/643,343

(22) Filed: Aug. 22, 2000

(51) Int. Cl.[7] ................................................. H01L 21/44
(52) U.S. Cl. .......................... 438/585; 438/713; 438/737; 438/738; 438/978
(58) Field of Search .................................. 438/585, 640, 438/673, 713, 737, 738, 978

(56) References Cited

U.S. PATENT DOCUMENTS

| | | |
|---|---|---|
| 4,980,316 | 12/1990 | Huebner . |
| 5,155,053 | 10/1992 | Atkinson . |
| 5,677,089 | 10/1997 | Park et al. . |
| 5,801,094 * | 9/1998 | Yew et al. .............................. 438/624 |
| 5,930,610 | 7/1999 | Lee . |
| 6,008,100 * | 12/1999 | Yeh et al. ............................. 438/305 |
| 6,077,733 * | 6/2000 | Chen et al. .......................... 438/585 |
| 6,184,142 * | 2/2001 | Chung et al. ........................ 438/692 |
| 6,235,626 * | 5/2001 | Makino et al. ....................... 438/637 |

* cited by examiner

Primary Examiner—Trung Dang
(74) Attorney, Agent, or Firm—Amin & Turocy, LLP

(57) ABSTRACT

A method for fabricating a Y-gate structure is provided. The method comprises the steps of providing a silicon layer having a gate oxide layer, a protection layer over the gate oxide layer, a first sacrificial layer over the protection layer and a second sacrificial layer over the first sacrificial layer. An inwardly sloping opening is formed in the second sacrificial layer and the opening is extended vertically in the first sacrificial layer. A contact material is deposited over the second sacrificial layer filling the opening with the contact material and forming a contact layer and portions of the contact material outside a gate region are removed. The first sacrificial layer and the second sacrificial layer are then removed.

20 Claims, 6 Drawing Sheets

Y-GATE FORMATION USING DAMASCENE PROCESSING

TECHNICAL FIELD

The present invention generally relates to semiconductor processing, and in particular to a method for forming a gate structure with a contact area wider than a base area.

BACKGROUND OF THE INVENTION

Historically, gate structures having a base area with a width that is smaller than the gate contact area (e.g., T-gate and Y-gate structures) have been advantageous in several technologies. For example, MESFET, HEMT (variant of gallium arsenide field effect transistor technology) mainly used in satellite broadcasting receivers, high speed logic circuits and power modules have employed gate structures with bases smaller than the contact area. These types of devices are required in field effect transistors for operation in ultra-high frequency ranges. The advantage of employing a gate structure with a shorter gate length is that the channel of the gate is reduced resulting in an increased in speed and a decrease in power consumption. Reducing the distance over which the gate's field effect control of the electrons in the channel reduces the parasitic resistances and capacitances that limit device speed. A shorter gate length decreases the transmit time for carriers in the channel but also increases the series resistance of the gate electrode itself, slowing down the device and degrading the frequency characteristics of the device. Providing a gate structure with a smaller base than its contact area decreases the gate channel while providing a low gate series resistance due to the wider contact area and, thus, improving the devices drive current capability and performance.

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Recent advances in CMOS transistor architecture make use of the T-gate or Y-gate structures where the polysilicon gate electrode is narrowed in the gate regions and wider on top of the gate. This is due to the ever increasing demand for scaling down semiconductor devices and scaling down power consumption requirements. However, the current methods for forming a gate structure with a contact region wider than its base suffers from shortcomings. For example, the etch process which narrows the base of the structure are known to be difficult to control especially with local pattern density. This can lead to variation in the gate width and asymmetric implant profiles. Another problem is related to manufacturing controls. The "re-entrant" or overhung profile prevents direct measurement of the critical gate length.

In view of the above, there is an unmet need for improvements in methodologies for formation of gate structures with contact areas that are wider than the base area.

SUMMARY OF THE INVENTION

One aspect of the invention relates to a method for fabricating a Y-gate structure comprising the steps of providing a silicon layer having a gate oxide layer, a protection layer over the gate oxide layer, a first sacrificial layer over the protection layer and a second sacrificial layer over the first sacrificial layer. An inwardly sloping opening is formed in the second sacrificial layer and the opening is extended vertically in the first sacrificial layer. A contact material is deposited over the second sacrificial layer filling the opening with the contact material and forming a contact layer and portions of the contact material outside a gate region are removed. The first sacrificial layer and the second sacrificial layer are then removed.

Another aspect of the present invention relates to another method for fabricating a Y-gate structure. A silicon layer is provided having a gate oxide layer, a protection layer over the gate oxide layer, the protection layer being one of a polysilicon and a germanium material, a first sacrificial layer over the protection layer and a second sacrificial layer over the first sacrificial layer. An inwardly sloping opening is formed in the second sacrificial layer and the opening is extended vertically in the first sacrificial layer. A contact material is deposited over the second sacrificial layer filling the opening with the contact material and forming a contact layer. The contact material is the other of a polysilicon material and a germanium material. Portions of the contact material outside a gate region are removed. The first sacrificial layer and the second sacrificial layer are then removed. Finally, portions of the protection layer and the gate oxide layer not forming a part of the Y-gate structure are removed.

Yet another aspect of the present invention provides for yet another method for fabricating a Y-gate structure. The method comprises the steps of providing a silicon layer having a gate oxide layer, a protection layer over the gate oxide layer, a first sacrificial layer over the protection layer, a second sacrificial layer over the first sacrificial layer and a third sacrificial layer over the second sacrificial layer. The second sacrificial layer is of a different material than the first and third sacrificial layers. A first opening is vertically etched in the third sacrificial layer. An angular etch is performed on the first opening to provide an inwardly sloping opening in the second sacrificial layer. The inwardly sloping opening is an extension of the first opening. The first opening and the inwardly sloping opening are vertically etched to extend the opening vertically in the first sacrificial layer. A contact material is then provided to fill the first opening. The first sacrificial layer, the second sacrificial layer and the third sacrificial layer are stripped and portions of the protection layer and the gate oxide layer not forming a part of the Y-gate structure are etched away using one of a wet etch and a vertical plasma etch.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
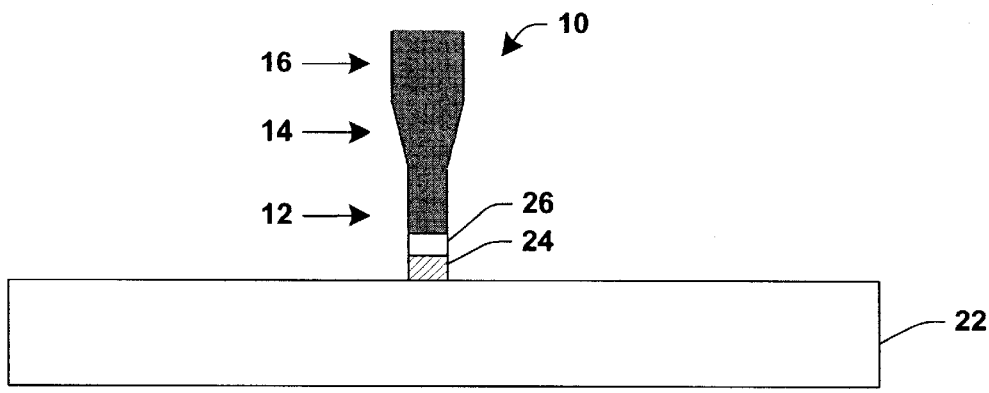
FIG. 1a is a schematic cross-sectional illustration of a Y-gate structure overlying a silicon layer in accordance with one aspect of the invention.

The present invention will now be described with reference to the drawings, wherein like reference numerals are used to refer to like elements throughout. The present invention is described with reference to a method for forming a Y-gate structure over a silicon layer to form a semiconductor with more speed and less power consumption. It is to be understood that the description of the various aspects of the present invention are merely illustrative and that they should not be taken in a limiting sense.

Figure 1B:
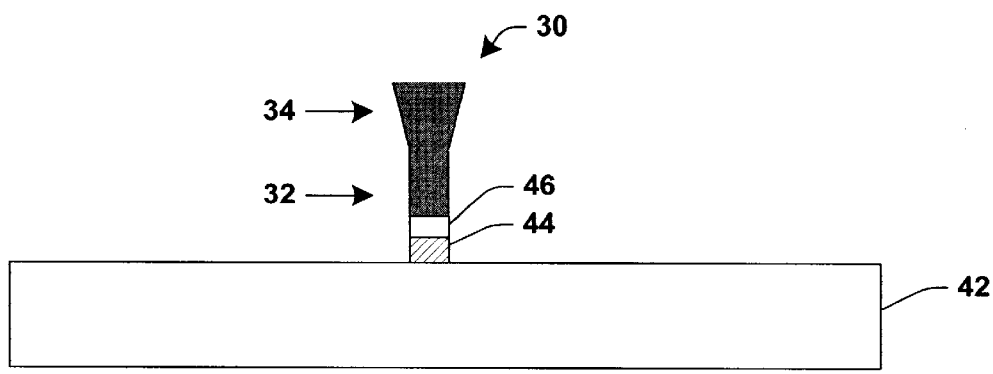
FIG. 1b is a schematic cross-sectional illustration of a Y-gate structure overlying a silicon layer in accordance with another aspect of the invention.

FIG. 1a illustrates a Y-gate structure 10 according to the present invention. The Y-gate structure 10 resides over a silicon layer 22 and includes a base portion 12, an inwardly sloping portion 14 and a top or contact portion 16. The base portion 12 has a gate oxide layer 24 and a silicon layer 26. The top or contact portion 16 is the gate contact area and can be comprised of polysilicon, germanium, amorphous silicon, metals or the like. A portion of the material forming the top or contact portion forms a part of the base portion 12 and the inwardly sloping portion 14. The base portion 12 has a width that is smaller than the top portion 16. FIG. 1b illustrates an alternate Y-gate structure 30 according to the present invention. The Y-gate structure 30 resides over a silicon layer 42 and includes a base portion 32, an inwardly sloping contact portion 34. The base portion 32 has a gate oxide layer 44 and a silicon layer 46. The top or contact portion 34 is the gate contact area and can be comprised of polysilicon, germanium, amorphous silicon, metals or the like. A portion of the material forming the top or contact portion 34 forms a part of the base portion 32. The base portion 32 has a width that is smaller than the top of the contact portion 34.

Figure 2:
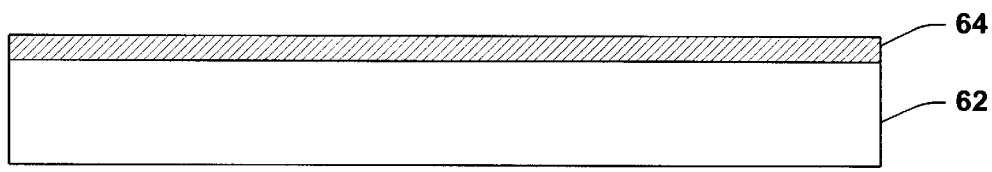
FIG. 2 is a schematic cross-sectional illustration of a silicon layer having a gate oxide layer in accordance with one aspect of the present invention.
Figure 3:
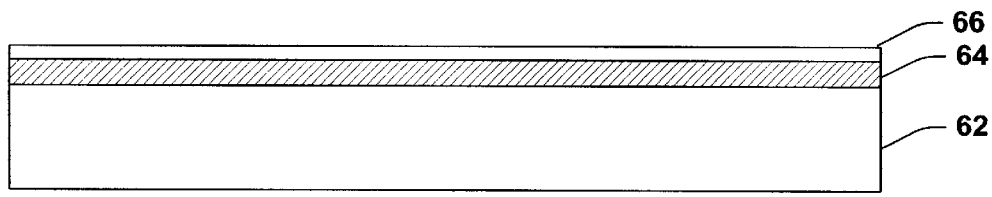
FIG. 3 is a schematic cross-sectional illustration of the structure of FIG. 2 having a protection layer over the gate oxide layer in accordance with one aspect of the present invention.

FIGS. 2–18 illustrate a methodology of fabricating the Y-gate structure of the present invention. FIG. 2 illustrates a structure 60 having a gate oxide layer 64 disposed over a silicon layer 62. The thin gate oxide material 64 is formed to have a thickness within the range of about 10–20 Å. Preferably, the thin gate oxide material 64 includes $SiO_2$ which has a substantially low dielectric constant. However, it is to be appreciated that any suitable material (e.g., $Si_3N_4$) for carrying out the present invention may be employed and is intended to fall within the scope of the present invention. A thin protection layer 66 is formed over the gate oxide material 64, as illustrated in FIG. 3. The thin protection layer 66 may be formed from polysilicon. Alternatively, the thin protection layer 66 may be formed from germanium. Preferably, the protection layer 66 is doped prior to the formation of the protection layer 66 over the gate oxide material 64. The protection layer 66 may have a thickness within the range of about 50 Å–150 Å.

Figure 4:
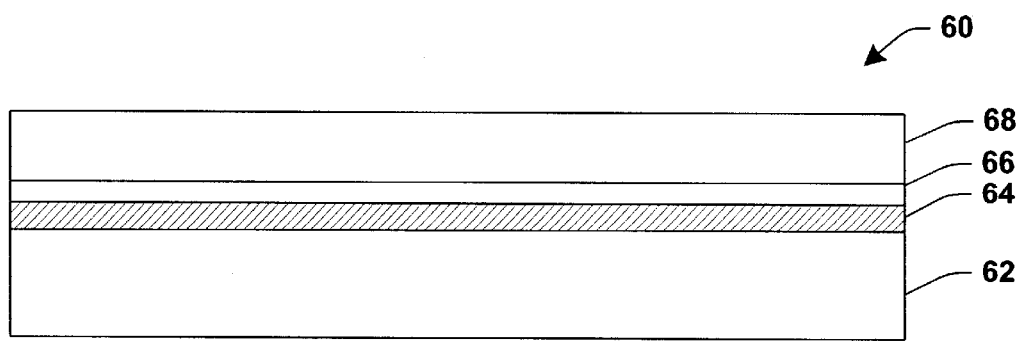
FIG. 4 is a schematic cross-sectional illustration of the structure of FIG. 3 having a first sacrificial layer over the protection layer in accordance with one aspect of the present invention.
Figure 5:
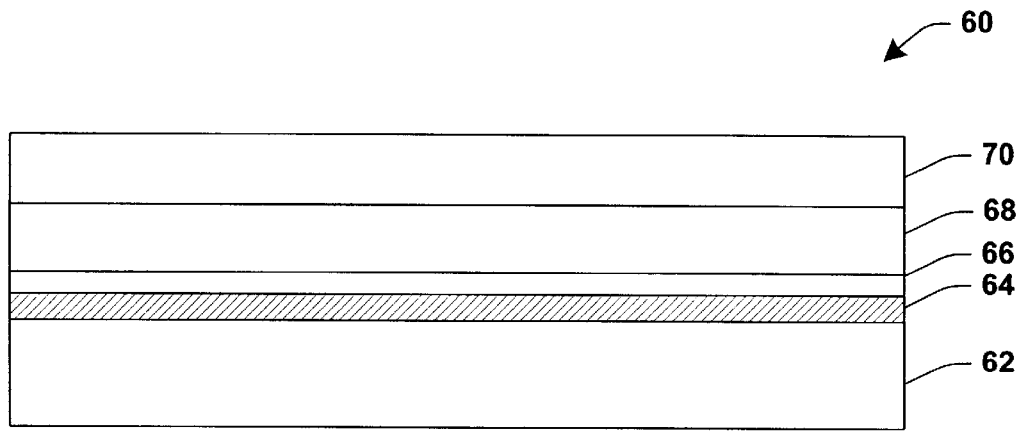
FIG. 5 is a schematic cross-sectional illustration of the structure of FIG. 4 having a second sacrificial layer over the first sacrificial layer in accordance with one aspect of the present invention.
Figure 6:
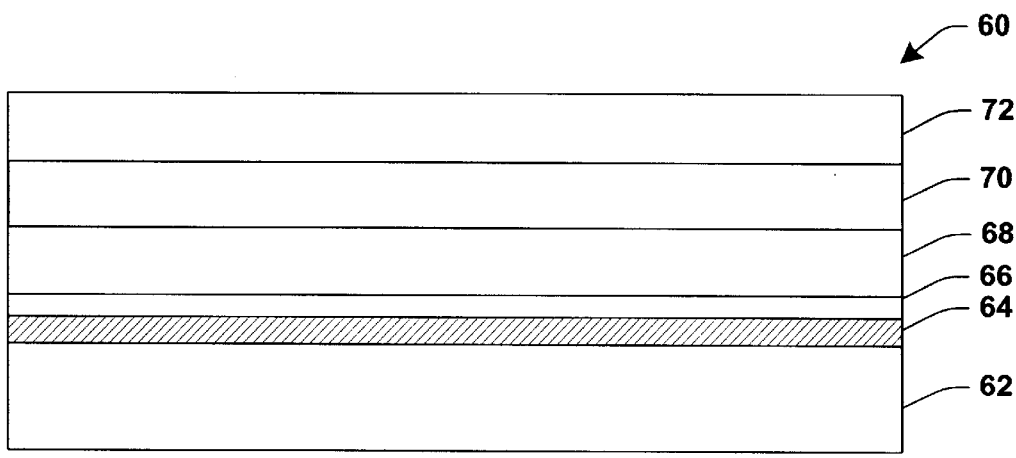
FIG. 6 is a schematic cross-sectional illustration of the structure of FIG. 5 having a third sacrificial layer over the second sacrificial layer in accordance with one aspect of the present invention.
Figure 7:
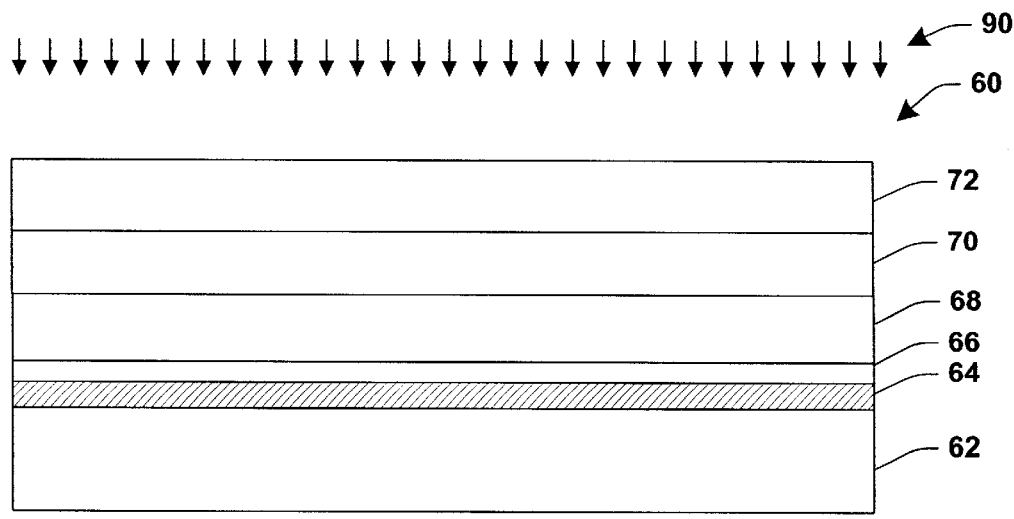
FIG. 7 is a schematic cross-sectional illustration of the structure of FIG. 6 undergoing an etching step in accordance with one aspect of the present invention.

A first sacrificial layer 68 is formed over the thin protection layer 66 (FIG. 4). A second sacrificial layer 70 is formed over the first sacrificial layer 68 (FIG. 5) and a third sacrificial layer 72 is formed over the second sacrificial layer 70. Any suitable technique (e.g., thermal oxidation, plasma enhanced chemical vapor deposition (CVD), thermal enhanced CVD and spin on techniques) may be employed in forming the sacrificial layers 68, 70 and 72. Sacrificial layers 68 and 72 can be silicon dioxide ($SiO_2$) and the sacrificial layer 70 can be silicon nitride (SiN). Preferably, each sacrificial layer has a thickness within the range of about 400 Å–600 Å. Other usuable sacrificial materials may be employed such as silicon nitride ($Si_3N_4$), silicon oxynitride ($SiO_xN_y$), and fluonated silicon oxide ($SiO_xF_y$), and polyimide(s). Preferably, the second sacrificial layer 70 is of a different material than the first and third sacrificial layers 68 and 72, so that separate etching steps can be performed on the sacrificial layers.

Figure 8:
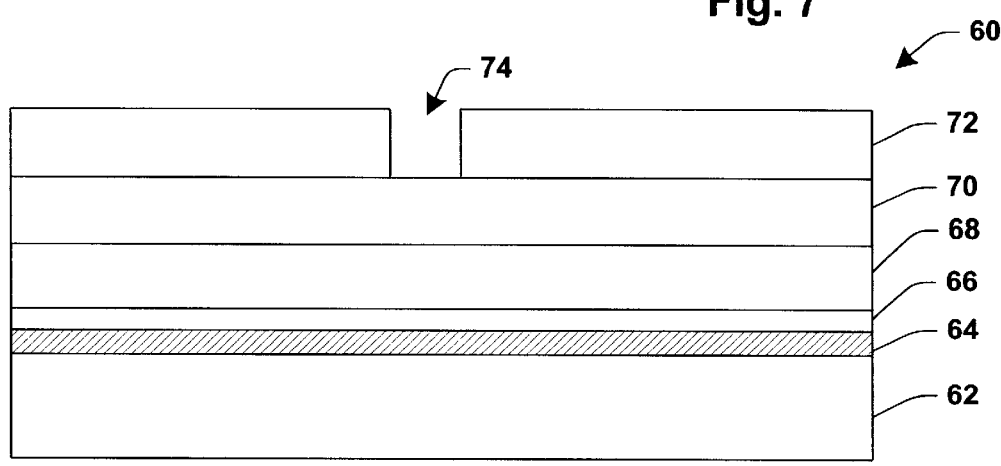
FIG. 8 is a schematic cross-sectional illustration of the structure of FIG. 7 after the third sacrificial layer has been etched in accordance with one aspect of the present invention.

An etch step 90 (e.g., anisotropic reactive ion etching (RIE)) (FIG. 7) is performed to form an opening 74 in the third sacrificial layer 72 (FIG. 8). A photoresist layer is first patterned (not shown) and is used as a mask for selectively etching the third sacrificial layer 72 to provide the opening 74 in the third sacrificial layer 72. Any suitable etch technique may be used to etch the third sacrificial layer 72. For example, the third sacrificial layer 72 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate a mask pattern to pattern a photoresist layer (not shown). The photoresist is etched using a dark field mask employing a positive resist or in the alternative with a clear field mask with a negative resist to form the opening in the photoresist. A selective etch is then performed employing the photoresist as a mask to thereby create the opening 74 in the third sacrificial layer 72. Preferably, a selective etch technique is used to etch the material of the third sacrificial layer 72 at a relatively greater rate as compared to the rate that the material of the patterned photoresist (not shown) and at a relatively greater rate as compared to the rate that the material of the underlying second sacrificial layer 70.

Figure 9:
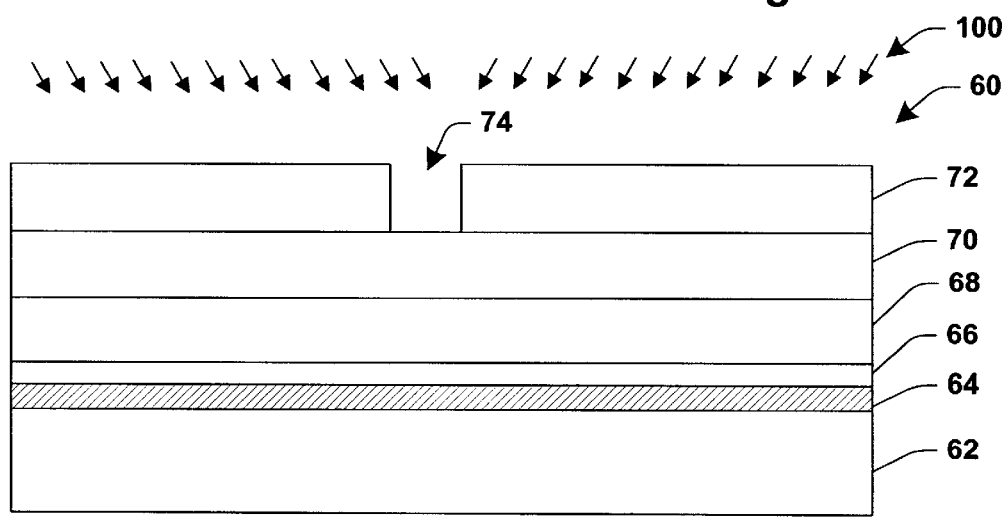
FIG. 9 is a schematic cross-sectional illustration of the structure of FIG. 8 undergoing an angular etching step in accordance with one aspect of the present invention.
Figure 10:
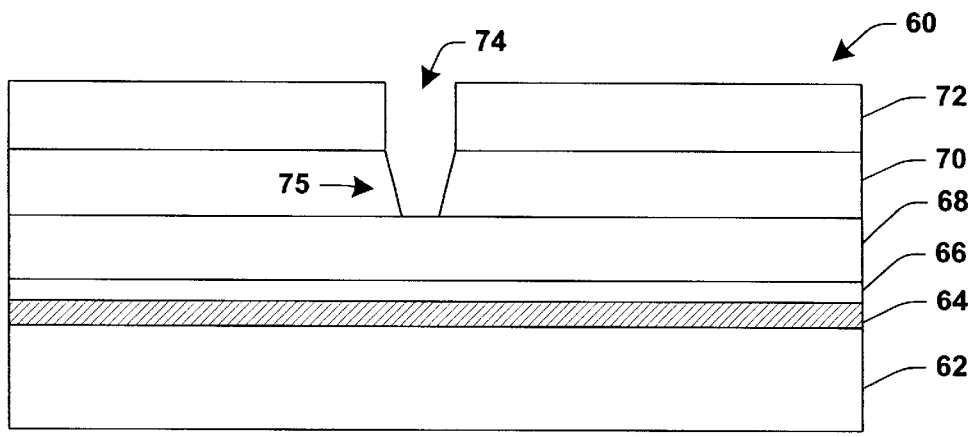
FIG. 10 is a schematic cross-sectional illustration of the structure of FIG. 9 after the second sacrificial layer has been etched in accordance with one aspect of the present invention.
Figure 11:
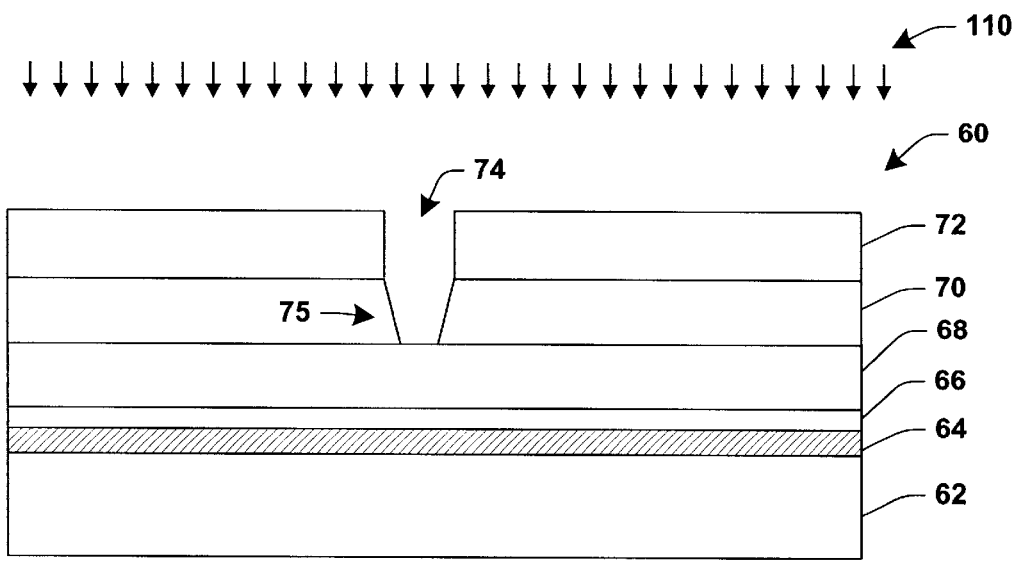
FIG. 11 is a schematic cross-sectional illustration of the structure of FIG. 10 undergoing another etching step in accordance with one aspect of the present invention.

After etching the third sacrificial layer 72, another etching step 100 is performed as illustrated in FIG. 9. The etching step 100 is an angular isotropic etching step to extend the opening 74 into the second sacrificial layer 70. The extended portion of the opening 74 is an inwardly sloping portion 75 (FIG. 10). A selective etch technique is used to etch the second sacrificial layer 70 at a greater rate than the first and third sacrificial layers 68 and 72, respectively. Any suitable etch technique may be employed to form the inwardly sloping portion 75 in the second sacrificial layer 70. For, example the inwardly sloping portion 75 may be formed by employing reactive ion etching (RIE), standard plasma etching, magnetically enhanced RIE, reactive ion beam ion etching, microwave plasma etching or radical beam etching for the desired isotropic etching result. For example, etching step 100 may be employed utilizing an isotropic etch with a plasma gas(es) (e.g., oxygen plasma), herein carbon tetrafloride ($CF_4$) containing fluorine ions, in a commercially available etcher, such as a parallel plate RIE apparatus or, alternatively, an electron cyclotron resonance (ECR) plasma reactor to form the inwardly sloping portion 75. In one aspect of the invention, the etching step 100 is etched using magnetic enhanced reactive ion etching (MERIE) or a high density plasma system using $Cl_2$ chemistry that will not substantially attack the underlying sacrificial layer. In another aspect of the invention, a MERIE method is used with reactant gases of $CL_2$ (30–100 sccm) and HBr(30–100 sccm) at a power level within the range of about 300–700W, and pressure within the range of about 10–250 mT.

Figure 12:
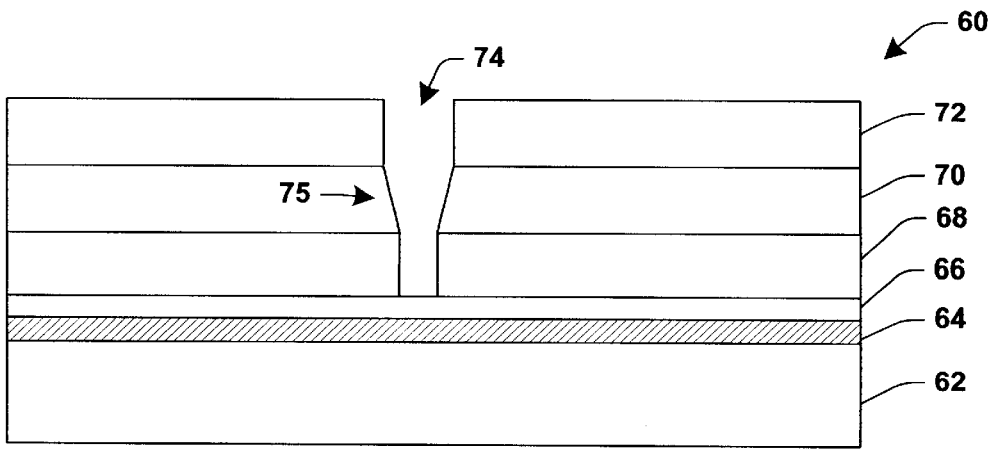
FIG. 12 is a schematic cross-sectional illustration of the structure of FIG. 11 after the first sacrificial layer has been etched in accordance with one aspect of the present invention.
Figure 13:
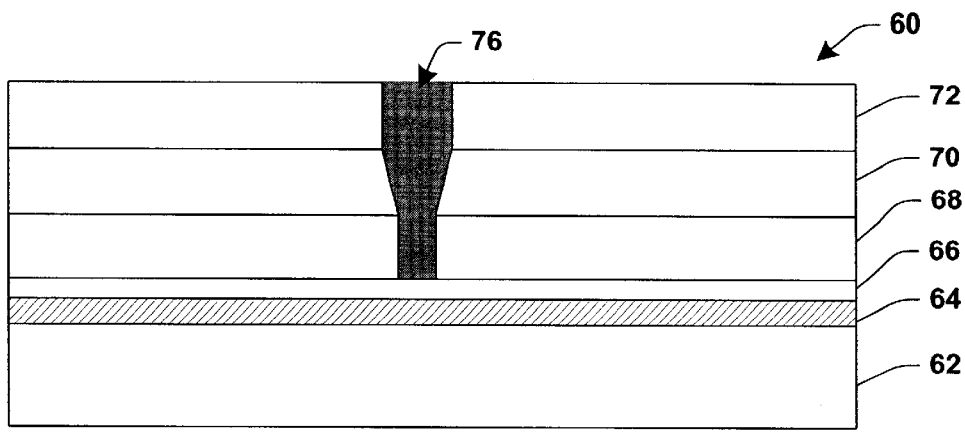
FIG. 13 is a schematic cross-sectional illustration of the structure of FIG. 12 after a deposition step in accordance with one aspect of the present invention.
Figure 14:
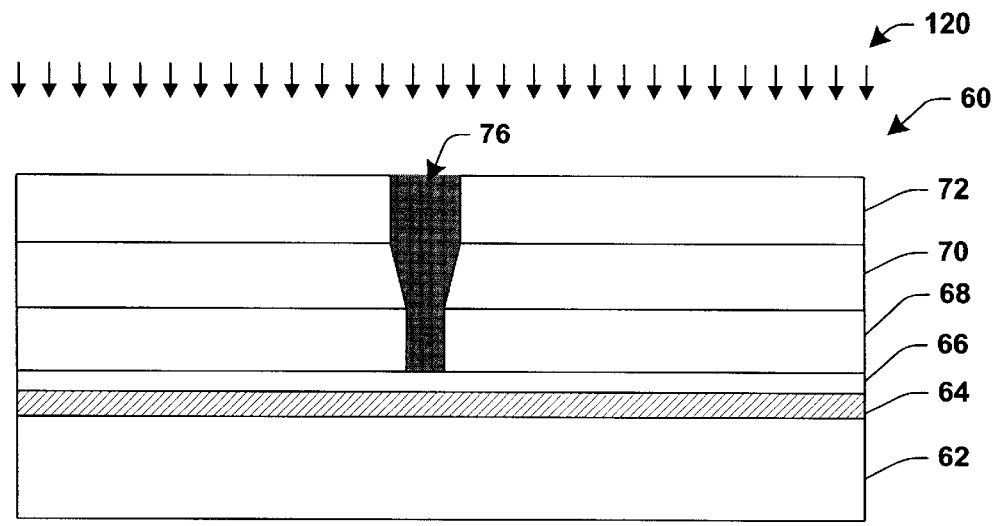
FIG. 14 is a schematic cross-sectional illustration of the structure of FIG. 13 undergoing a stripping step in accordance with one aspect of the present invention.

A vertical etch step 110 (e.g., anisotropic reactive ion etching (RIE)) (FIG. 11) is performed to extend the opening 74 in the first sacrificial layer 68 (FIG. 12). The inwardly sloping portion 75 is used as a mask for selectively etching the sacrificial layer 68 to provide the extension in the opening 74 in the first sacrificial layer 68. Any suitable etch technique may be used to etch the first sacrificial layer 68. For example, the first sacrificial layer 68 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor. Preferably, a selective etch technique is used to etch the material of the first sacrificial layer 68 at a relatively greater rate as compared to the rate that the material of the patterned photoresist (not shown) and at a relatively greater rate as compared to the rate that the material of the second sacrificial layer 70 and at a relatively greater rate as compared to the underlying protection layer 66. A stripping step (e.g., ashing in an $O_2$ plasma) can then be performed to remove the remaining portions of the patterned photoresist layer (not shown).

Next, a damascene fill or deposition step is performed on the structure 60 (FIG.13) to form a Y-gate structure 76 in the structure 60. The Y-gate structure 76 can be comprised of polysilicon, amorphous silicon, germanium, metals or the like. If the Y-gate structure 76 is comprised of polysilicon, a contact layer may be formed using any suitable technique including chemical vapor deposition (CVD) techniques, such as low pressure chemical vapor deposition (LPCVD) or plasma enhanced chemical vapor deposition (PECVD). If the Y-gate structure 76 is comprised of amorphous silicon or germanium, standard deposition techniques may be employed. If the contact layer 72 is comprised of a metal, standard sputtering techniques may be employed. After formation of the contact layer, the contact layer is polished down to the underlying sacrificial layer to form the Y-gate structure 76.

Figure 15:
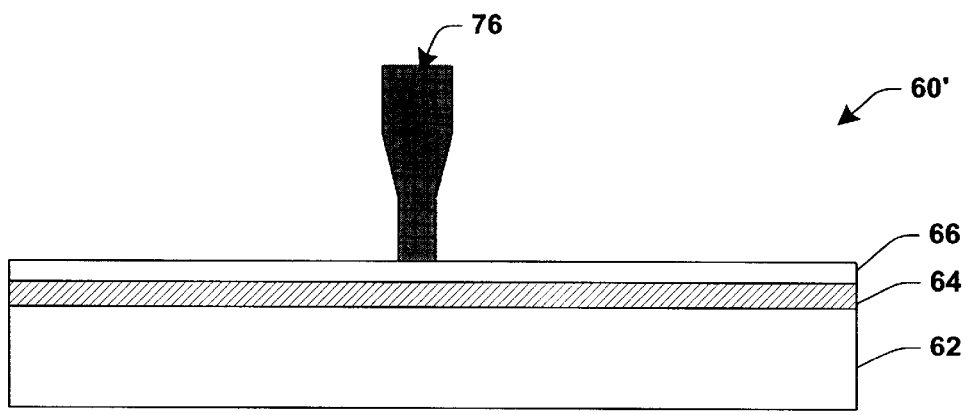
FIG. 15 is a schematic cross-sectional illustration of the structure of FIG. 14 after undergoing a stripping step in accordance with one aspect of the present invention.
Figure 16:
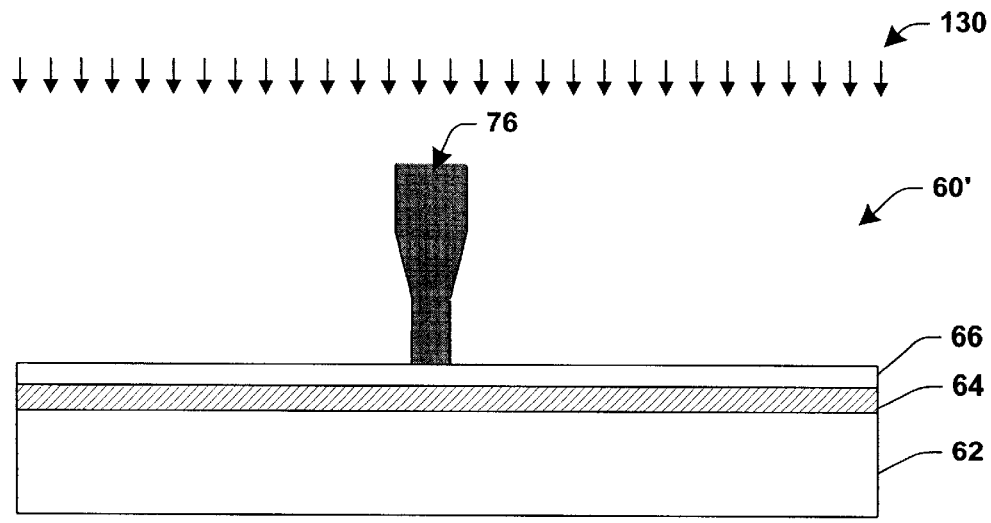
FIG. 16 is a schematic cross-sectional illustration of the structure of FIG. 15 undergoing a protection layer and a gate oxide layer removal step in accordance with one aspect of the present invention.
Figure 17:
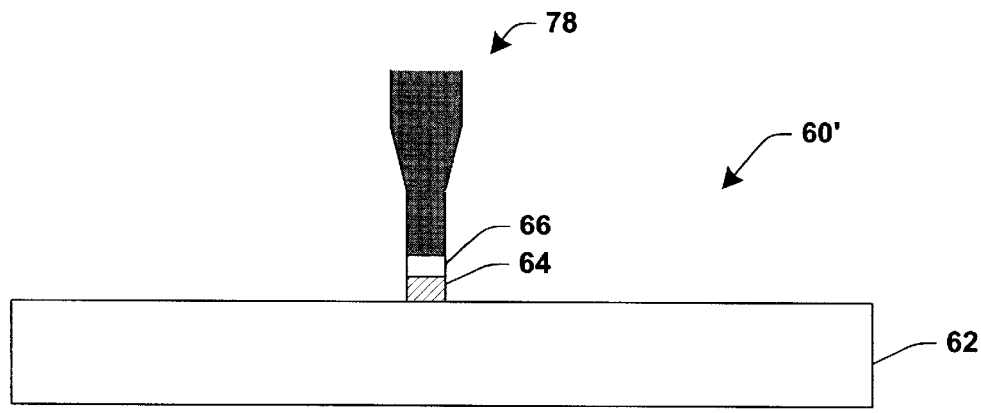
FIG. 17 is a schematic cross-sectional illustration of the structure of FIG. 16 after undergoing a protection layer and a gate oxide layer removal step in accordance with one aspect of the present invention.

A stripping step 120 (FIG. 14) is then performed to remove the first, second and third sacrificial layers 72, 70 and 68, respectively, to form the structure 60', as illustrated in FIG. 15. The stripping step 120 may be an anisotropic gaseous stripping process. After the sacrificial layers are removed an etch step 130 is performed (FIG. 16) to remove portions of the sacrificial layer 66 and the gate oxide layer 64 that do not form part of the gate structure 76. The etch step 130 may be a wet etch, for example, hydrofluoric acid (HF) may be employed via an HF dip to remove portions of the protection layer 66 and the gate oxide layer 64 that do not form part of the gate structure 76. However any suitable wet etch technique can be utilized to remove portions of the protection layer 66 and the gate oxide layer 64 that do not form part of the gate structure 76. Alternatively, the etch step 130 may be a vertical plasma etch. If the protection layer 66 is germanium and the contact layer polysilicon, it may be easier to remove the germanium as compared to a protection layer 66 of polysilicon due to the differences in the material. Additionally, if the protection layer 66 is polysilicon and the contact layer germanium, it may be easier to remove the polysilicon as compared to a protection layer 66 of germanium due to the differences in the material. This is because a selective etch technique can be employed that etches one of the polysilicon or germanium at a relatively greater rate as compared to the rate of the other material. During the etch step 130, the Y-gate structure 76 loses about the same thickness as the thickness of the protection layer 66 if the same material is employed for the contact material and the protection layer 66 to result in a Y-gate structure 78, as illustrated in FIG. 17. However, due to the thickness of the Y-gate structure 76 the gate operation is not affected.

Figure 18:
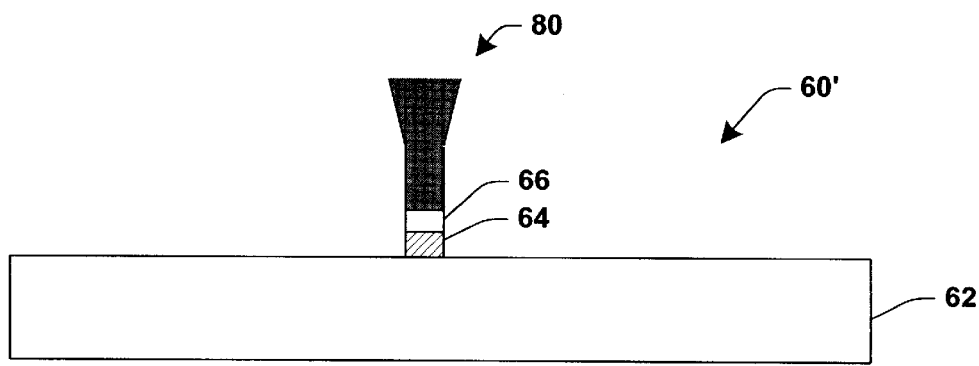
FIG. 18 is a schematic cross-sectional illustration of the structure of FIG. 17 wherein only the first and second sacrificial layers are employed in accordance with one aspect of the present invention.

FIG. 18 illustrates an alternate aspect of the invention in which a Y-gate structure 80 is provided by employing only the first and the second sacrificial layers 68 and 70, respectively. All that is necessary in forming the Y-gate structure 80 of FIG. 18 is the elimination of the step of forming the third sacrificial layer 72 illustrated in FIG. 6 and the etching step 90 of FIG. 7 to form the opening 74 in the third sacrificial layer 72 illustrated in FIG. 8. Instead the sacrificial layer 72 as illustrated in FIGS. 6–14 can be replaced with a photoresist layer for forming a patterned opening to provide a mask for etching the inwardly sloping portion 75 in the second sacrificial layer 70.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a Y-gate structure comprising the steps of:
    providing a silicon layer having a gate oxide layer, a protection layer over the gate oxide layer, a first sacrificial layer over the protection layer and a second sacrificial layer over the first sacrificial layer;
    forming an inwardly sloping opening in the second sacrificial layer;
    extending the opening vertically in the first sacrificial layer;
    depositing a contact material over the second sacrificial layer filling the opening with the contact material and forming a contact layer;
    removing portions of the contact material outside a gate region; and
    removing the first sacrificial layer and the second sacrificial layer.

2. The method of claim 1, the first sacrificial layer and the second sacrificial layer including at least two of silicon oxide, silicon dioxide, silicon nitride ($Si_3N_4$), (SiN), silicon oxynitride, ($SiO_xN_y$), fluonated silicon oxide ($SiO_xF_y$), and polyimide(s) wherein the first sacrificial layer is formed from a different material than the second sacrificial layer.

3. The method of claim 1, the step of depositing a contact material comprising the step of depositing with one of polysilicon, germanium, amorphous polysilicon and metal.

4. The method of claim 1, the step of forming an opening in the second sacrificial layer comprising providing a photoresist layer over the second sacrificial layer, etching an opening in the photoresist layer to expose the second sacrificial layer and angularly etching the exposed second sacrificial layer to form the inwardly sloping opening.

5. The method of claim 1, the step of removing the first and second sacrificial layer comprising stripping the first and second sacrificial layers employing an anisotropic gaseous stripping process.

6. The method of claim 1, further comprising the step of removing portions of the protection layer and the gate oxide layer not forming a part of the Y-gate structure.

7. The method of claim 6, the step of removing portions of the protection layer and the gate oxide layer not forming a part of the Y-gate structure comprising the step of performing an etch on the protection layer and the gate oxide layer.

8. The method of claim 7, the etch on the protection layer and the gate oxide layer being one of a wet etch and a vertical plasma etch.

9. The method of claim 1, further comprising the step of providing a third sacrificial layer over the second sacrificial layer wherein the third sacrificial layer is comprised of a different material than the second sacrificial layer.

10. The method of claim 9, the first sacrificial layer, the second sacrificial layer and the third sacrificial layer including at least two of silicon oxide, silicon dioxide, silicon nitride ($Si_3N_4$), (SiN), silicon oxynitride, ($SiO_xN_y$), fluonated silicon oxide ($SiO_xF_y$), and polyimide(s) wherein the second sacrificial layer is formed from a different material than the first and the third sacrificial layers.

11. The method of claim 9, further comprising the step of forming a first opening in the third sacrificial layer prior to forming the inwardly sloping opening in the second sacrificial layer wherein the inwardly sloping opening is an extension of the first opening.

12. The method of claim 11, the step of forming the first opening in the third sacrificial layer comprising providing a photoresist layer over the third sacrificial layer, etching an opening in the photoresist layer to expose the third sacrificial and vertically etching the exposed third sacrificial layer to form the first opening.

13. The method of claim 1, the protection layer being formed from one of polysilicon and germanium.

14. The method of claim 1, further including the step of forming the protection layer to have a thickness within the range of about 50 Å to 150 Å.

15. The method of claim 1, further including the step of forming the first sacrificial layer to have a thickness within the range of about 400 Å to 600 Å and the step of forming the second sacrificial layer to have a thickness within the range of about 400 Å to 600 Å.

16. A method for fabricating a Y-gate structure comprising the steps of:
    providing a silicon layer having a gate oxide layer, a protection layer over the gate oxide layer, the protection layer being one of a polysilicon and a germanium material, a first sacrificial layer over the protection layer and a second sacrificial layer over the first sacrificial layer;
    forming an inwardly sloping opening in the second sacrificial layer;
    extending the opening vertically in the first sacrificial layer;
    depositing a contact material over the sacrificial layer filling the opening with the contact material and forming a contact layer, the contact material being the other of a polysilicon material and a germanium material;
    removing portions of the contact material outside a gate region;
    removing the first sacrificial layer and the second sacrificial layer; and
    removing portions of the protection layer and the gate oxide layer not forming a part of the T-gate structure.

17. The method of claim 16, further comprising the step of providing a third sacrificial layer over the second sacrificial layer wherein the third sacrificial layer is comprised of a different material than the second sacrificial layer.

18. The method of claim 17, the first sacrificial layer, the second sacrificial layer and the third sacrificial layer including at least two of silicon oxide, silicon dioxide, silicon nitride ($Si_3N_4$), (SiN), silicon oxynitride, ($SiO_xN_y$), fluonated silicon oxide ($SiO_xF_y$), and polyimide(s) wherein the second sacrificial layer is formed from a different material than the first and the third sacrificial layers.

19. The method of claim 18, further comprising the step of forming a first opening in the third sacrificial layer prior to forming the inwardly sloping opening in the second sacrificial layer wherein the inwardly sloping opening is an extension of the first opening.

20. A method for fabricating a Y-gate structure comprising the steps of:

provideing a silicon layer having a gate oxide layer, a protection layer over the gate oxide layer, a first sacrificial layer over the protection layer, a second sacrificial layer over the first sacrificial layer and a third sacrificial layer over the second sacrificial layer, the second sacrificial layer being of a different material than the first and third sacrificial layers;

vertically etching a first opening in the third sacrificial layer;

angularly etching the first opening to provide an inwardly sloping opening in the second sacrificial layer, the inwardly sloping opening being an extension of the first opening;

vertically etching the first opening and the inwardly sloping opening to extend the opening vertically in the first sacrificial layer;

depositing a contact material in the first opening;

stripping the first sacrificial layer, the second sacrificial layer and the third sacrificial layer; and, etching portions of the protection layer and the gate oxide layer not forming a part of the Y-gate structure using one of a wet etch and a vertical plasma etch.

* * * * *